United States Patent [19]
Yuan et al.

[11] Patent Number: 5,646,062
[45] Date of Patent: Jul. 8, 1997

[54] METHOD FOR ESD PROTECTION CIRCUIT WITH DEEP SOURCE DIFFUSION

[75] Inventors: Lee Chung Yuan, Chung-Li; Joe Ko, Hsin-Chu, both of Taiwan

[73] Assignee: United Microelectronics Corporation, Hsin-Chu, Taiwan

[21] Appl. No.: 374,965

[22] Filed: Jan. 19, 1995

[51] Int. Cl.$^6$ .............................. H01L 21/70; H01L 27/00
[52] U.S. Cl. ................. 437/60; 437/40 AS; 437/40 GS; 437/41 AS; 437/162; 437/904
[58] Field of Search ....................... 437/40 AS, 40 GS, 437/41 AS, 154, 51, 47, 60, 162, 904

[56] References Cited

U.S. PATENT DOCUMENTS

| | | | |
|---|---|---|---|
| 5,060,037 | 10/1991 | Rountree | 357/23 |
| 5,081,514 | 1/1992 | Ueoka | 357/23.13 |
| 5,087,955 | 2/1992 | Futami | 357/41 |
| 5,366,908 | 11/1994 | Pelella | 437/51 |
| 5,372,956 | 12/1994 | Baldi | 437/34 |
| 5,374,565 | 12/1994 | Hsue et al. | 437/30 |
| 5,416,036 | 5/1995 | Hsue | 437/51 |

Primary Examiner—Jey Tsai
Attorney, Agent, or Firm—William H. Wright

[57] ABSTRACT

An improved semiconductor structure forms a series of FETs that are each connected between an input pad and ground for protecting the semiconductor device from an electrostatic discharge that may appear at the pad. Diffusions form alternate drain and source regions and are spaced apart at the surface of the device. Gate electrodes are located over the substrate between the diffusions so that the drain diffusion on one side of a gate also forms the drain for the FET on the one side and the source diffusion on the other side also forms the source diffusion for an FET on the other side. The electrical connection between the pad and the drain diffusions is formed by connections through the overlying insulation to a midpoint in the drain diffusion. Electrical connections between the gate and ground are formed by extending the conductive pattern that forms the gate. An electrical connection is made between the source diffusion and the gate electrode by a buried contact technique. A conductor is formed over the source diffusion as part of the process of forming the gate electrode, and the two electrodes are physically and conductively connected. The drain diffusions are made deeper than the source diffusions.

3 Claims, 4 Drawing Sheets

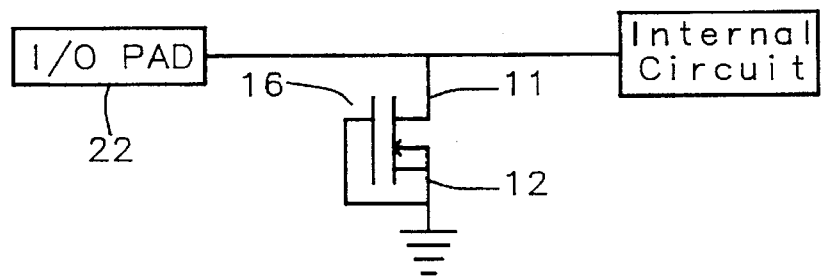
*FIG. 1*
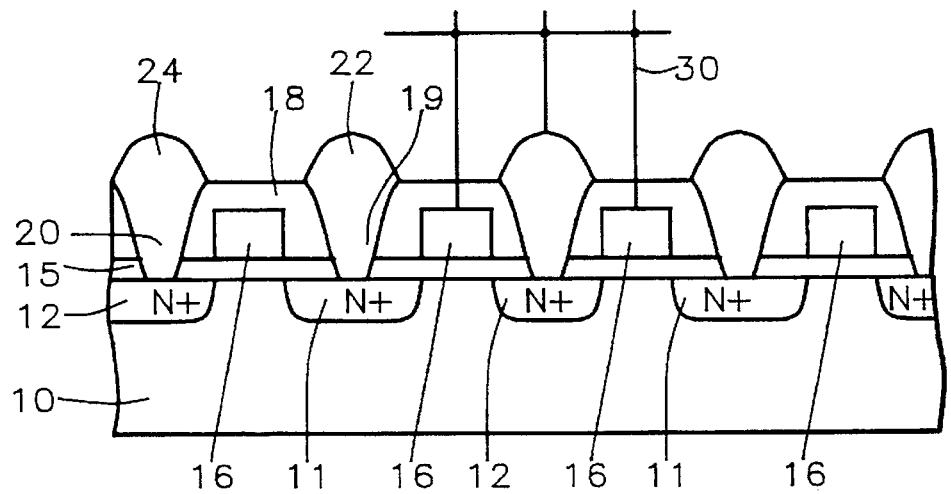
*FIG. 2 - Prior Art*
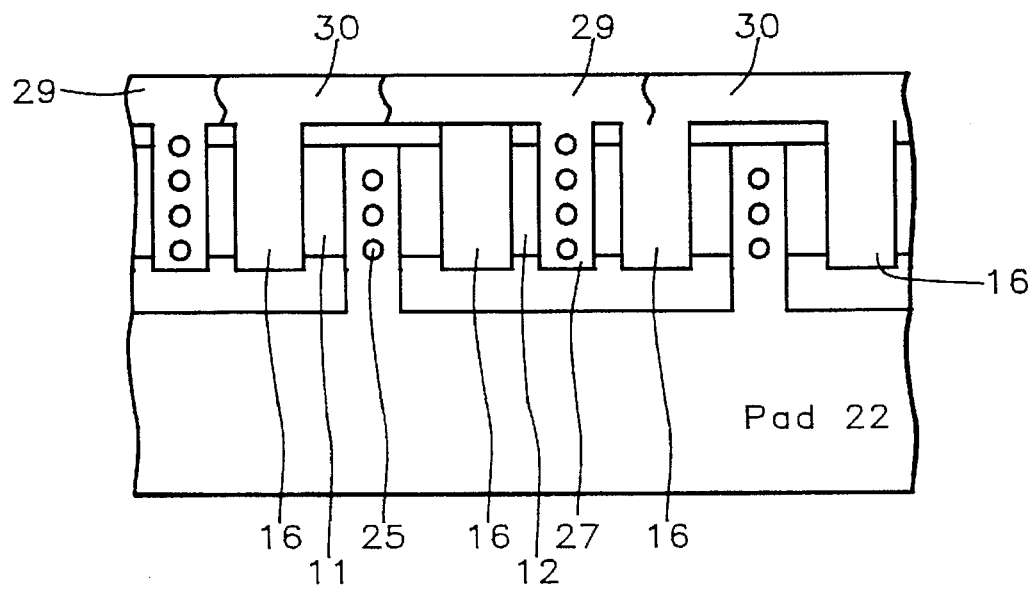
*FIG. 3 - Prior Art*

5,646,062

METHOD FOR ESD PROTECTION CIRCUIT WITH DEEP SOURCE DIFFUSION

FIELD OF THE INVENTION

This invention relates to semiconductor devices and more specifically to a circuit for protecting circuits of a semiconductor device from the high voltage of an electrostatic discharge (ESD).

INTRODUCTION

ESD is a familiar problem in the design of semiconductor devices. ESD voltages can appear at the input/output pads of the device, and the devices commonly have protection circuits that turn on when an ESD voltage appears at a pad. These circuits conduct the ESD current to one of the power supply terminals and thereby limit the voltage to a value that should not damage the other circuits.

Since a semiconductor chip may have a protection circuit for each pad, the protection circuits can take up an undesirably large area of the chip, and it is a general object in this art to reduce the size of these circuits.

These problems increase as the semiconductor devices are made with higher density circuits. In these high density devices, the diffusions are made shallower and the gate oxide is made thinner. Since the protection circuits are manufactured as part of the process of manufacturing the logic and memory circuits of a chip, they also have thinner oxide and shallower junctions. The thinner oxide is less able to handle an ESD voltage, and the shallower junctions increase the current density of an electrostatic discharge. Thus, both characteristics of high density circuits limit the ESD current a given protection circuit can handle.

In some manufacturing processes for circuits with high density, a problem has occurred with the source and drain implantation that has caused damage to the gate oxide. The source-drain implantation is a high current implant which can cause a high charge on the polysilicon gate to damage the thin gate silicon oxide. The circuit of this invention has a self-connected buried contact structure that can release the charge through the buried contact junction, as will be explained later. This problem has made it more difficult to provide ESD protection.

The problem with the source and drain implantation is particularly difficult with the polycide gate process. The gate has a layer of polysilicon and an overlying layer of tungsten silicide and this structure collects more charge than a gate with only polysilicon.

THE PRIOR ART

This invention provides an improved semiconductor structure for a known prior art protection circuit in which an FET is connected to conduct ESD currents between the line to be protected and ground. The gate and the source of this FET are connected to ground and the drain is connected to the line to be protected. When a high voltage of one polarity appears at the associated pad, the drain-substrate junction of this FET is forward biased and the ESD current is conducted across this junction and the voltage at the pad is limited to the forward voltage drop of this junction. When a high voltage of the opposite polarity appears at the pad, the drain-substrate junction is reverse biased and it breaks down, and a parasitic NPN bipolar transistor turns on to conduct the ESD current.

Commonly these FETs are formed with the source and drain diffusions in an interlocking finger structure that provides more area to handle a larger current. The drain diffusions are connected in common to the pad (the hot side) and the source diffusions are connected in common to ground (the cold side).

SUMMARY OF THE INVENTION

The ESD protection circuit of this invention has an FET connected between the pad and ground, as in the prior art, which operates in the way already described. In addition, the invention can be implemented with the desirable interlocking finger structure of the prior art.

One object of this invention is to provide a new and improved protection circuit for a semiconductor chip that has a high density of logic and storage devices which have shallow diffusions. It is desirable to make the ESD protection device with deep diffusions because the deep diffusions which improve the ability of the device to carry the ESD current.

In the structure of this invention, the drain diffusions have their conventional shallow depth, which is established by the depth selected for corresponding diffusions of the other FETs of the same chip. The source diffusions are made deeper than the drain diffusions.

Another object of the invention is to reduce the area of silicon that is required for the gate electrodes and the source diffusions and their interconnections (the "cold side" of the protective circuit). This object is achieved by making the connection to the source diffusions by a buried contact structure that eliminates the separate connection of the prior art.

The buried contact requires an additional step in the process, but many memory products have the buried contact structure and the buried contact structure of this invention can be formed when these buried contacts are formed.

THE DRAWING

FIG. 1 is schematic of circuit of a prior art protection circuit.

FIG. 2 is the edge view of a prior art structure implementing the circuit of FIG. 1.

FIG. 3 is the top view of the prior art structure.

THE PREFERRED EMBODIMENT

The Prior Art—FIGS. 1-3

Figure 4:
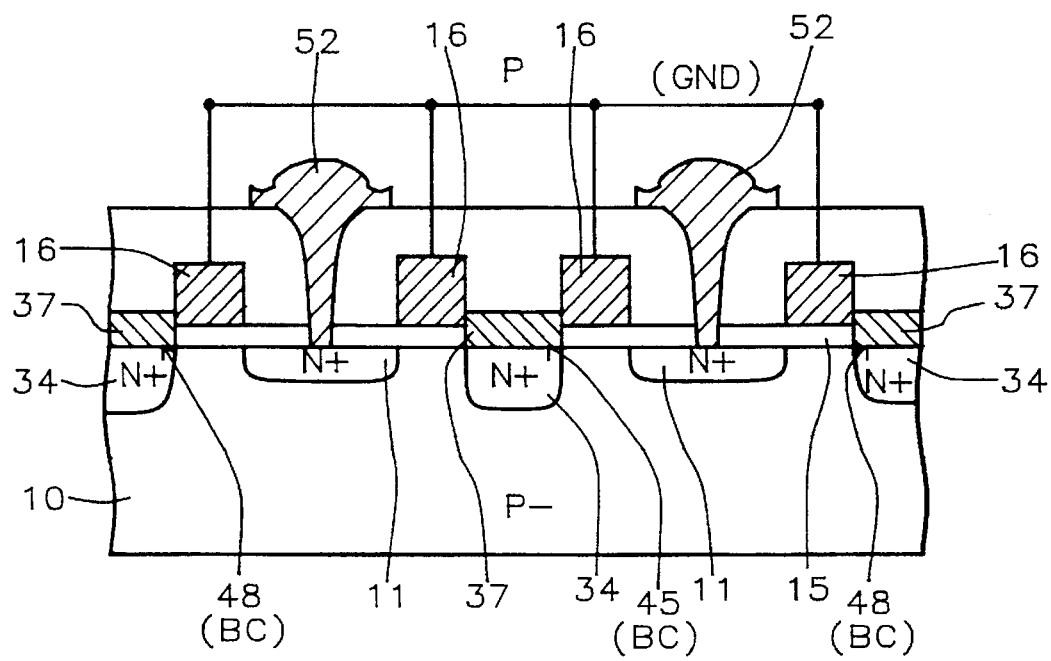
FIG. 4 is the edge view of the device of this invention.

It will be helpful to review the prior art device to understand more easily some of the features that are used in the circuit of this invention.

The FET circuit of FIG. 1 will be understood from the introductory description, and it is provided as a reference for the description of the device of FIGS. 2 and 3. The drain 11, source 12, gate 16 of the FET and the pad 22 correspond to structures in the other Figs. with these reference characters.

As the edge view of FIG. 2 shows, the device has a P⁻ substrate 10, drain diffusions 11, source diffusions 12, a gate oxide layer 15, and gate electrodes 16. Insulation 18 is formed over the gate electrodes and the gate oxide and then openings are formed in this insulation for contacts 19 to the drain diffusions 11 and contacts 20 to the source diffusions 12. In FIG. 2, the electrical connections to the gate electrodes 16 and contacts 19 and 20 are shown schematically. The structure of these conductors is shown in the plan view of FIG. 3.

As the prior art structure is shown in the plan view of FIG. 3, the hot side comprises the I/O pad 22, the drain diffusions 11, and the overlying conductors 24, which extend from the pad. The conductors 24 are formed from highly doped polysilicon and the contacts 19 that extend through the field oxide 18 are shown as small circles 25. The cold side comprises the gate electrodes 16 and their connection 30 to ground, the source diffusions 12, and a polysilicon conductor 29 for the source diffusions. Source conductor 29 partly overlies the a metal pattern 30 for the gate electrodes (as can be seen where conductor 29 is broken away in FIG. 3) and these two layers are interconnected by contacts 31.

The drain diffusions 11 are made wider than the source diffusions 12 because they are on the hot side where a breakdown will occur.

Figure 5:
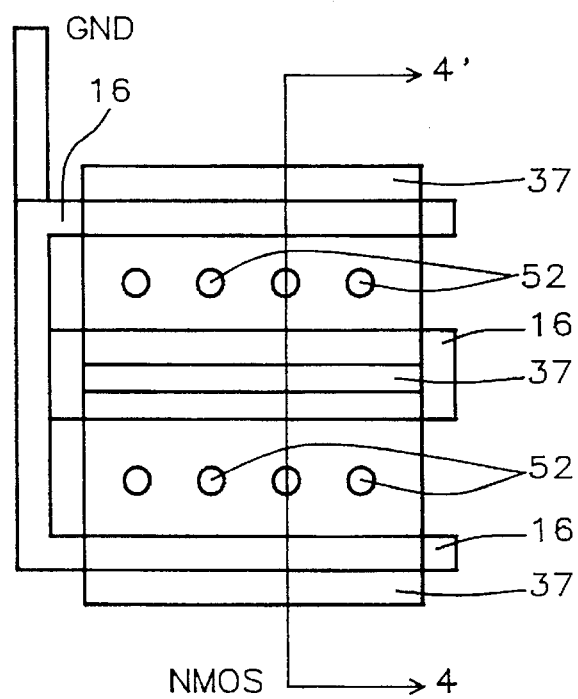
FIG. 5 is the top view of the invention.

The Protection Device—FIGS. 4 and 5

The substrate 10, the gate insulation layer 15, and the gate electrodes 16 will be recognized from the description of the prior art of FIGS. 2 and 3. The drain diffusions 11 are also like the prior art, but a new structure is provided for the source diffusions 34 and their connecting structure.

The edge view of FIG. 4 shows the deeper source diffusions 34, which will be discussed in the description of FIGS. 6A to 6D.

Polysilicon layer 37 overlies the source diffusions 12 and make electrical contact with the source diffusions. They span the space between the two gate electrodes 16 that share the source diffusion and they make electrical contact with these gate electrodes.

The plan view of FIG. 5 shows the electrical connection between the source diffusions 34 and ground. The path includes the connection that is made through the gate and the buried contact.

The Manufacturing Process—FIGS. 6A to 6E

Figure 6A:
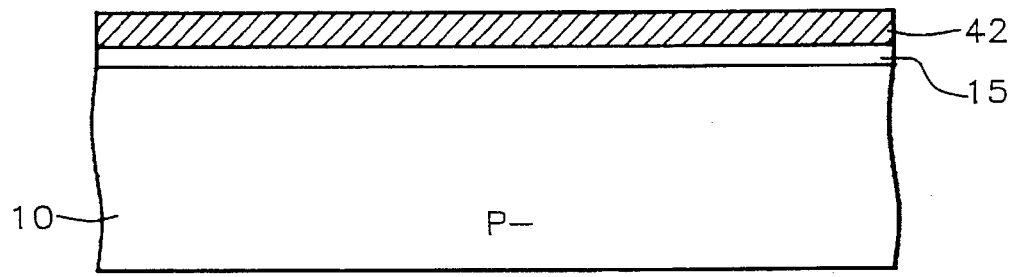
FIGS. 6A to 6E are edge views of the structure of FIG. 3 at successive stages of the preferred manufacturing process.

FIG. 6A shows the P− substrate 10, the gate silicon oxide layer 15 and a poly silicon layer 42 that will form the gate electrodes and their connections to ground. The structure of FIG. 6A is formed by forming a gate silicon oxide layer 15 by thermal oxidation in a suitable ambient of water and oxygen at an elevated temperature of 900 C. or more. A polysilicon layer 42 is deposited by chemical vapor deposition, using silane for example at temperatures above 550 C. The thickness of layer 42 is preferably between about 500 to 1000 Angstroms. This layer can be doped in situ or after it has been deposited by ion implantation or diffusion, as is understood in this art. It will be understood by those skilled in the art that the shown active surface region of monocrystalline silicon substrate 10 are isolated from other such active surface regions by silicon oxide surface isolation, such as recessed oxide isolation (not shown).

Figure 6B:
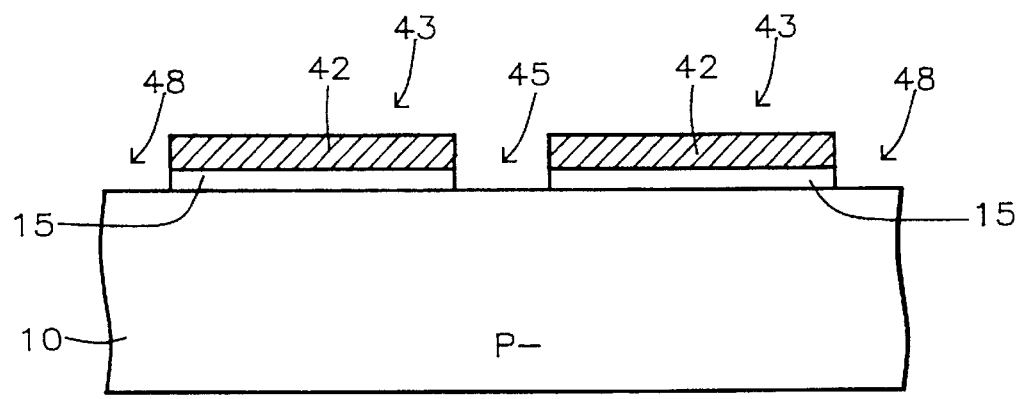

FIG. 6B shows the gate poly layer 42 and the underlying gate oxide 15 selectively removed to form islands 43 and intervening openings 45 and 48. This structure is formed using lithography and etching techniques as is understood by those skilled in the art wherein different etches are used for the polysilicon layer 42 and silicon oxide layer 15. Gate electrodes 16 will be formed at the ends of each island 43, and buried contacts will be formed in openings 45. The openings 45 are at the location of the planned source regions with buried contacts thereover. The drain diffusions 11 are planned to be wider than the source diffusions 12, and the two gates on the same island are more widely spaced than the two gates on opposite sides of openings 45. The pattern represented by FIG. 6B is extended to the right and/or the left to provide a selected number of FETs.

Figure 6C:
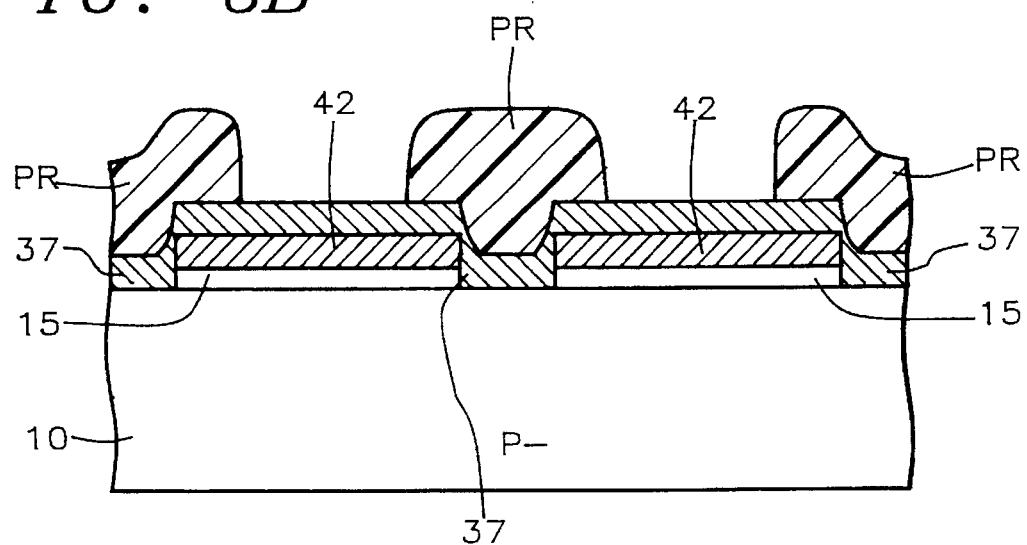

Referring now more particularly to FIG. 6C, a second layer 37 of polysilicon is deposited over the patterned polysilicon layer 42 and openings to substrate 10. The layer 37 is then conductively doped by POCl$_3$ diffusion or ion implantation using P31 (an isotope of phosphorous). Layer 37 is conformal as is shown. The photoresist layer PR is deposited and lithography patterned to form the desired mask as shown in FIG. 6C. Using the resist mask as seen in FIG. 6C, the polysilicon layers 37 and 42 are etched down to the gate oxide layer 15 using the dry reactive ion etching method. The openings formed are for the planned drain regions. The photoresist mask is removed by an etching process.

Figure 6D:
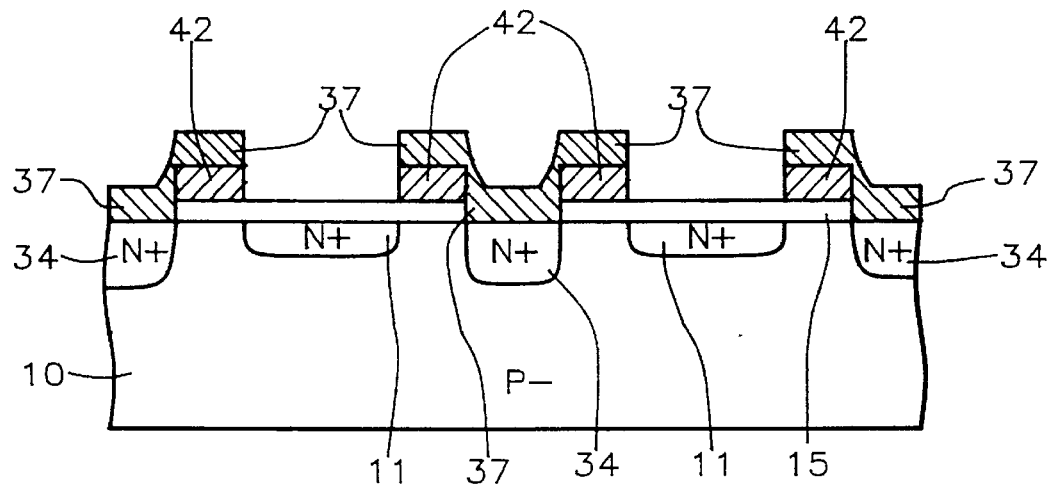

In FIG. 6D, there is shown the result of the polysilicon etching step after the photoresist mask has been removed. The openings and the polysilicon layer remaining are now subjected to $N^+$ ion implantation, As75 (an isotope of arsenic) to form N+ drain regions in the P− substrate 10. The result is shown as FIG. 6D. The actual activation of the N+ ions of FIG. 6D is done to form regions 11 during the later BPSG step discussed in FIG. 6E.

Figure 6E:
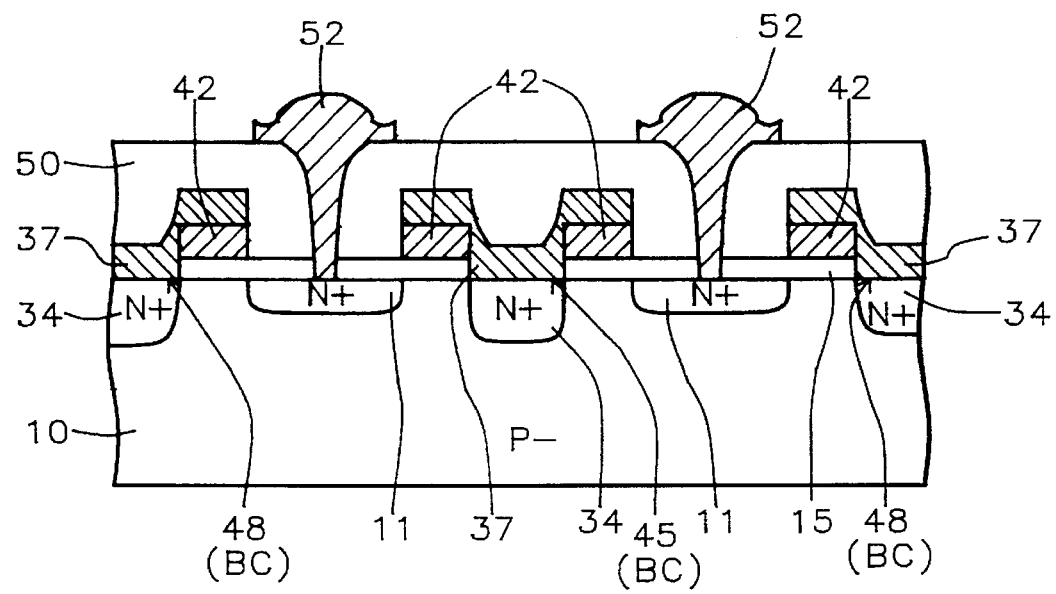

Referring to FIG. 6E, a borophosphosilicate glass (BPSG) layer 50 or the like is chemically vapor deposited (CVD) over the surfaces of the active devices as is known in the art. The structure is now heated or annealed at 850 C. to 950 C. to activate the N+ ions to (first) form N+ drain regions 11, (second) densify the BPSG layer 50, and (third) cause out diffusion from polysilicon layer 37 to form buried source regions 34. The P31 dopant in source regions 34 will move more deeply into the substrate 10 than the As ions in drain regions 11 because it is a lighter atom. This causes the desired effect of deeper source regions 34 than drain regions 11.

Contact openings are made through the BPSG layer 50 to drain regions 11 using known lithography and etching processes. Metal such as aluminum or aluminum alloy with silicon and/or copper is then blanket deposited and patterned to form electrical contacts 52 to drain regions 11 as seen in FIG. 6E.

The preferred impurity concentration for the polysilicon layer 37 and the polysilicon layer 42 is $10^{15}$ to $10^{16}$ atoms per cubic centimeter.

Other Embodiments

The preferred device has a P− substrate, and the corresponding structure for an N− substrate will be evident from a simple description later. Those skilled in the art will recognize other modifications of the preferred embodiment within the spirit of the invention and the intended scope of the claims.

We claim:

1. A method for manufacturing a protection circuit in a semiconductor substrate for a semiconductor device comprising the following steps:

forming and patterning a layer of a first conductive layer as part of gate electrode elements;

forming a doped second conductive layer over said portions of gate electrode elements thereby forming gate electrodes, wherein said second conductive layer further overlies a region where a source diffusion is to be formed in the semiconductor substrate, thereby forming a buried contact for said source diffusion, forming a drain diffusion in the semiconductor substrate;

forming the source diffusion under the buried contact by out diffusing dopants from the doped second conductive layer through the buried contact, the source diffusion extending deeper into said substrate than the drain diffusion.

2. The method of claim 1 including the step of forming a circuit ground, and wherein the step of forming the first conductive layer includes the step of forming an electrical connection between the gate electrodes and said circuit ground.

3. The method of claim 2 wherein other diffusions for a plurality of FETs are formed in the substrate, the other diffusions having a first depth, and wherein the drain diffusion is formed in the substrate between adjacent gates simultaneously with said other diffusions and to said first depth.

* * * * *